US011404360B2

(12) United States Patent
Zhang et al.

(10) Patent No.: US 11,404,360 B2
(45) Date of Patent: Aug. 2, 2022

(54) POWER MODULE WITH ENHANCED HEAT DISSIPATION

(71) Applicant: TEXAS INSTRUMENTS INCORPORATED, Dallas, TX (US)

(72) Inventors: Zhemin Zhang, Allen, TX (US); Yi Yan, Sunnyvale, CA (US); Hiep Xuan Nguyen, Cedar Hill, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 17/139,571

(22) Filed: Dec. 31, 2020

(65) Prior Publication Data
US 2022/0208662 A1 Jun. 30, 2022

(51) Int. Cl.
| | |
|---|---|
| H01L 23/495 | (2006.01) |
| H01L 23/31 | (2006.01) |
| H01L 21/78 | (2006.01) |
| H01L 23/552 | (2006.01) |
| H01L 23/64 | (2006.01) |
| H01L 21/48 | (2006.01) |
| H01L 21/56 | (2006.01) |

(52) U.S. Cl.
CPC .... *H01L 23/49568* (2013.01); *H01L 21/4825* (2013.01); *H01L 21/565* (2013.01); *H01L 21/78* (2013.01); *H01L 23/3107* (2013.01); *H01L 23/4952* (2013.01); *H01L 23/49513* (2013.01); *H01L 23/49575* (2013.01); *H01L 23/552* (2013.01); *H01L 23/645* (2013.01)

(58) Field of Classification Search
CPC .......... H01L 23/49568; H01L 23/3107; H01L 23/49513; H01L 23/4952; H01L 23/49575; H01L 23/552; H01L 23/645
USPC ......................................... 257/531, 659, 375
See application file for complete search history.

(56) References Cited

U.S. PATENT DOCUMENTS 10,453,602 B2 * 10/2019 Yoshioka .............. H01F 27/323
10,497,506 B2 * 12/2019 Massolini ............ H01F 27/288

\* cited by examiner

*Primary Examiner* — Quoc D Hoang
(74) *Attorney, Agent, or Firm* — Dawn Jos; Charles A. Brill; Frank D. Cimino

(57) ABSTRACT

In some examples, an electronic device comprises a first magnetic member, a first adhesive layer abutting the first magnetic member, a second magnetic member, a second adhesive layer abutting the second magnetic member, and a laminate member between the first and second adhesive layers. The laminate member comprises first and second transformer coils, an electromagnetic interference (EMI) shield coil, and a set of thermally conductive members coupled to the EMI shield coil and extending in three dimensions. At least some of the thermally conductive members extend vertically through a thickness of the laminate member so as to be exposed to top and bottom surfaces of the laminate member. The electronic device includes a thermally conductive component coupled to at least one thermally conductive member in the set of thermally conductive members.

21 Claims, 17 Drawing Sheets

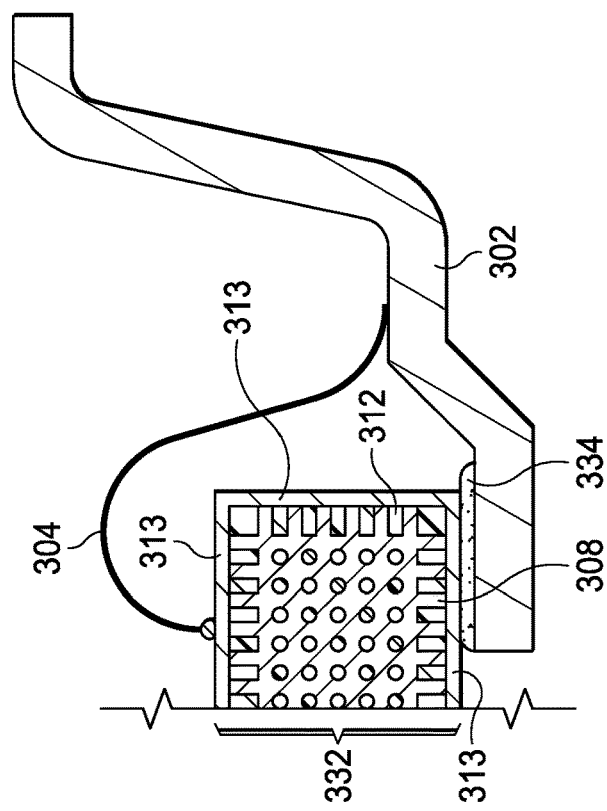
FIG. 3D1
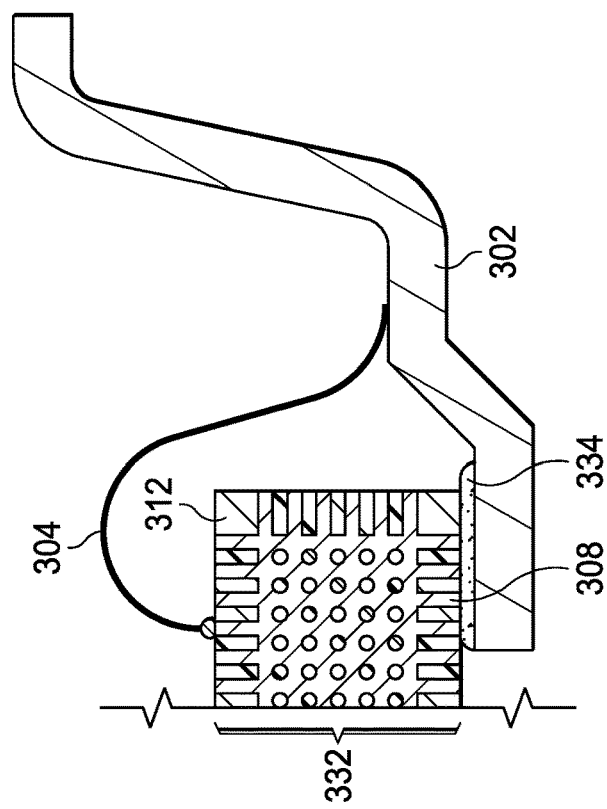
FIG. 3C1

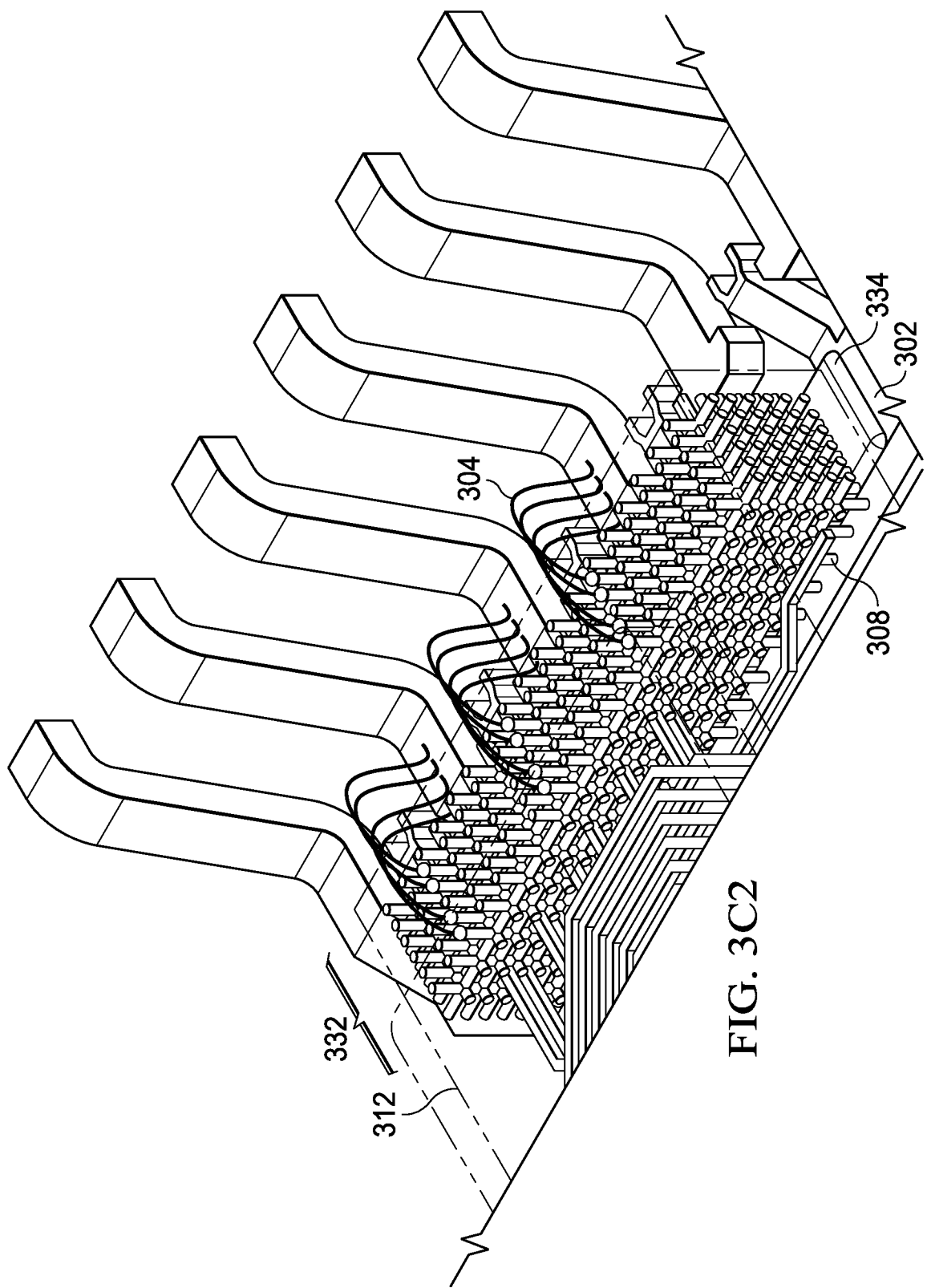
FIG. 3C2

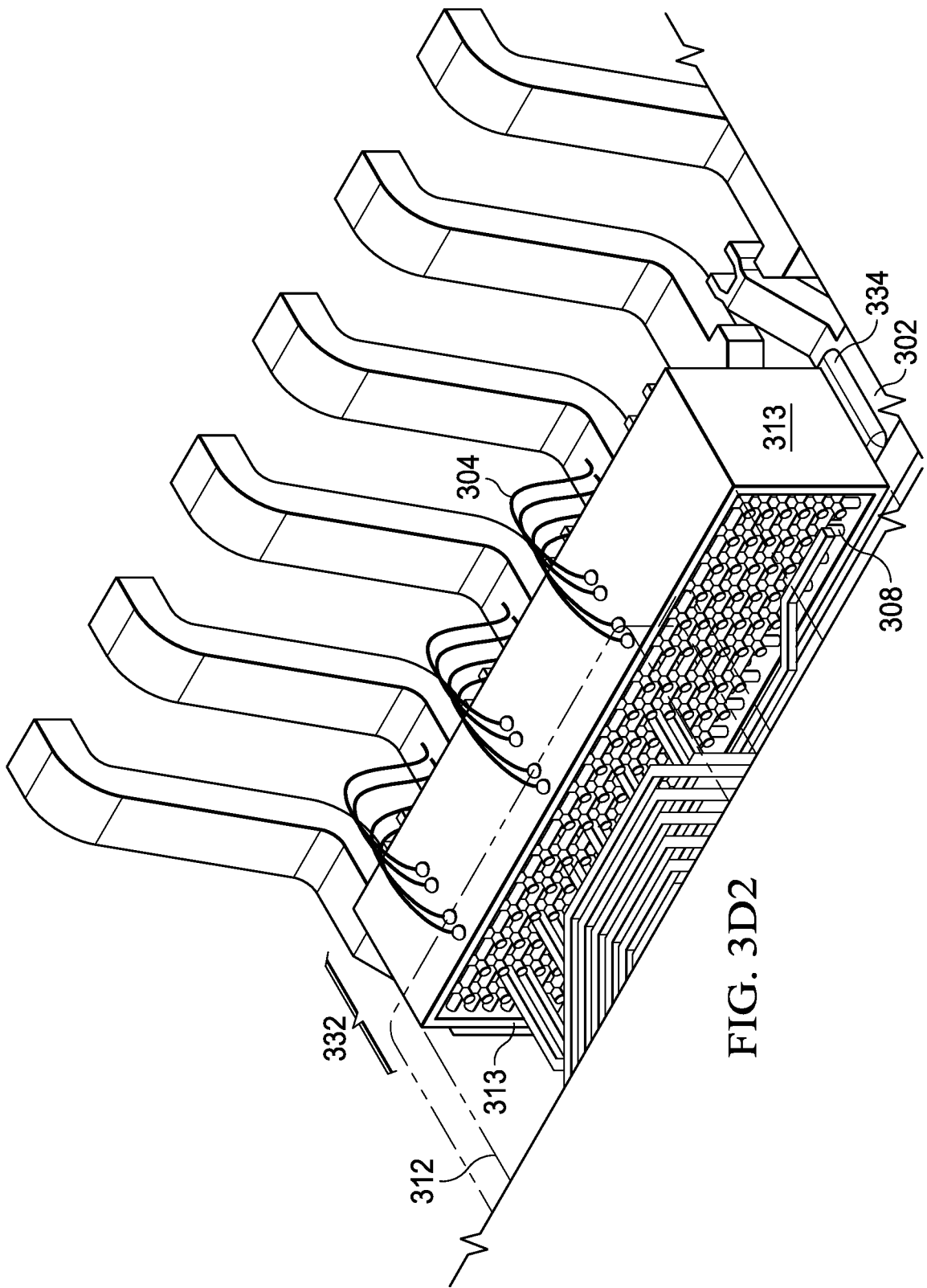
FIG. 3D2

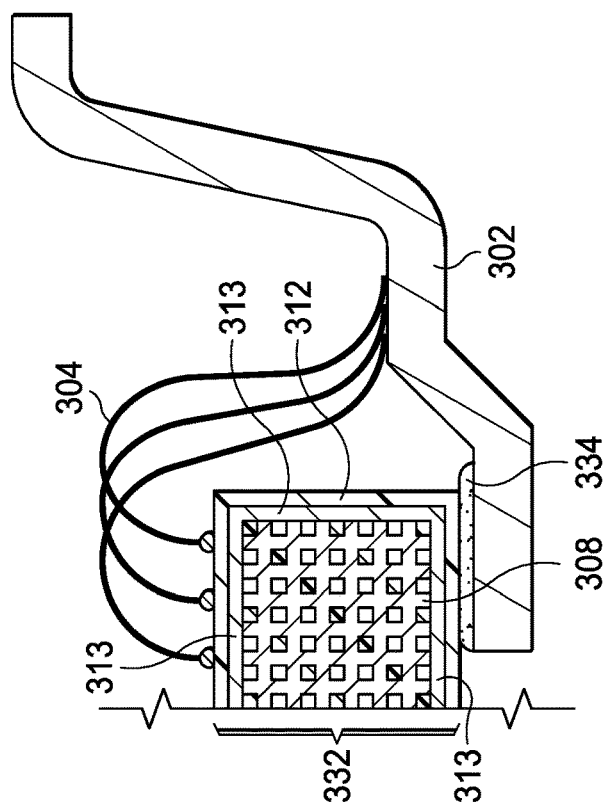
FIG. 3F1
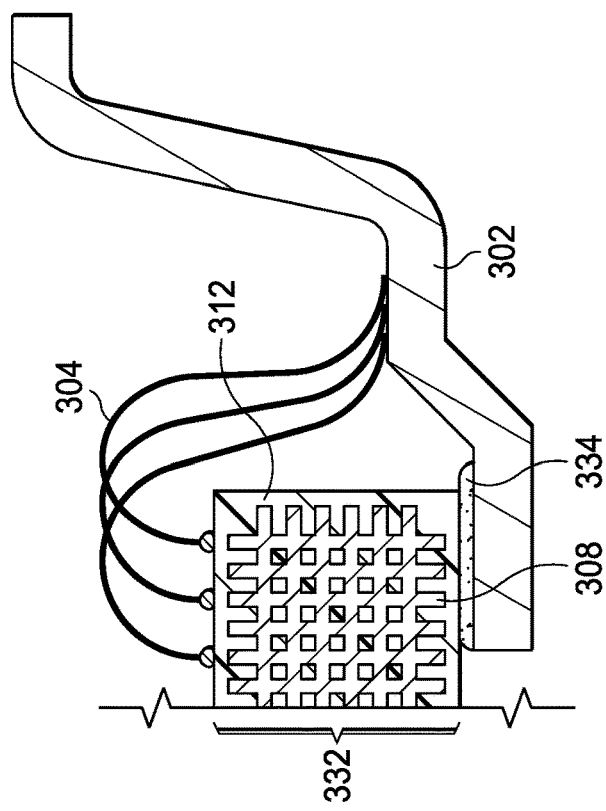
FIG. 3E1

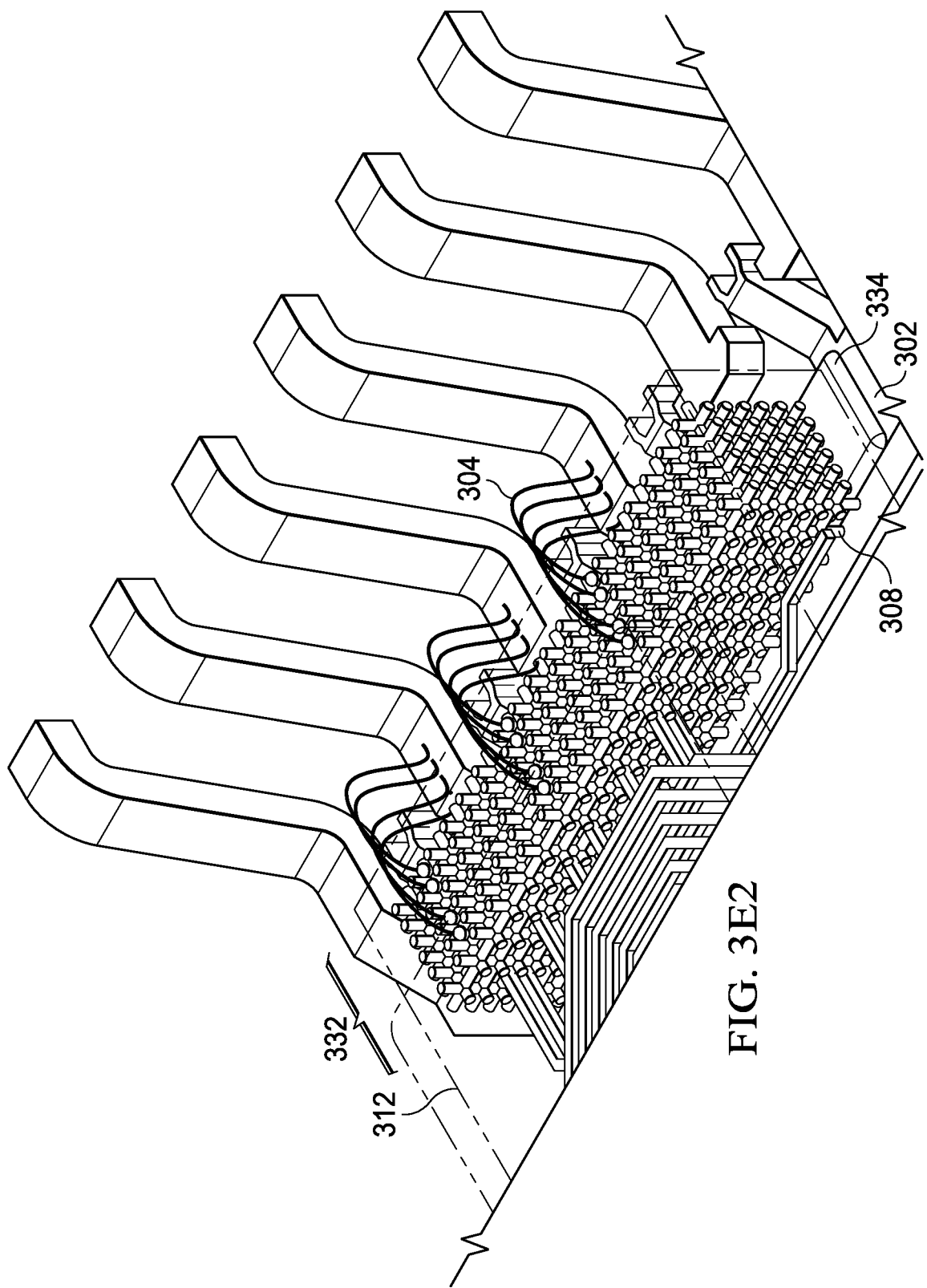
FIG. 3E2

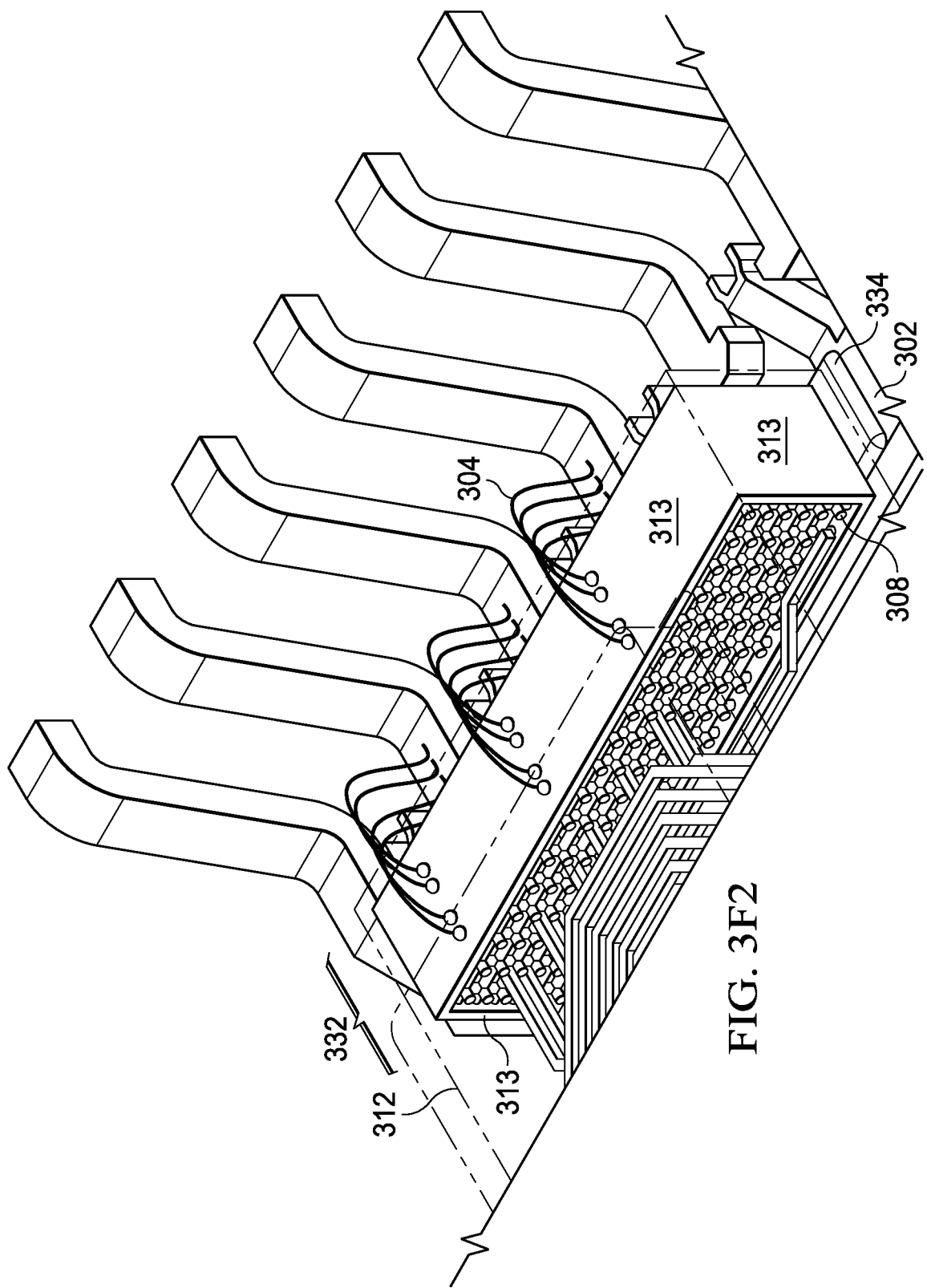
FIG. 3F2

POWER MODULE WITH ENHANCED HEAT DISSIPATION

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals. Other components, such as transformers, may be included within such packages.

SUMMARY

In some examples, an electronic device comprises a first magnetic member, a first adhesive layer abutting the first magnetic member, a second magnetic member, a second adhesive layer abutting the second magnetic member, and a laminate member between the first and second adhesive layers. The laminate member comprises first and second transformer coils, an electromagnetic interference (EMI) shield coil, and a set of thermally conductive members coupled to the EMI shield coil and extending in three dimensions. At least some of the thermally conductive members extend vertically through a thickness of the laminate member so as to be exposed to top and bottom surfaces of the laminate member. The electronic device includes a thermally conductive component coupled to at least one thermally conductive member in the set of thermally conductive members.

BRIEF DESCRIPTION OF THE DRAWINGS

For a detailed description of various examples, reference will now be made to the accompanying drawings in which:

FIGS. 3A-3H are top-down, profile cross-sectional, and perspective views of a power module in accordance with various examples.

DETAILED DESCRIPTION

Various components may be included inside a package. Many such components may generate heat as they operate. For example, a power module that includes a transformer may generate heat as current flows through the transformer coils. Because excessive heat may be deleterious to the functional and/or structural integrity of a package, a power module should dissipate heat effectively. Different power module architectures, however, have differing abilities to dissipate heat. Some power modules efficiently dissipate heat. In contrast, some power modules include transformer coils that are embedded within a laminate member, and this laminate member may restrict heat dissipation.

This disclosure describes various examples of a power module that efficiently dissipates heat through a laminate member. The power module includes a transformer having a laminate member and a pair of magnetic members coupled to opposing horizontal surfaces of the laminate member. The laminate member includes a first portion that is vertically aligned with the magnetic members and that includes transformer coils. The laminate member includes second and third portions at opposing ends of the laminate member, with each of the second and third portions including a set of thermally conductive members. The second and third portions are not vertically aligned with the magnetic members. Each set of thermally conductive members may include, for example, a three-dimensional matrix of thermally conductive members. Each set of thermally conductive members may collect heat generated by the transformer coils and carry the heat toward a surface of the laminate member, thus enhancing heat dissipation relative to other power modules. In some examples, the collection of heat from the transformer coils may be enhanced by using electromagnetic interference (EMI) shield coils in the first portion of the laminate member. These EMI shield coils may couple to the sets of thermally conductive members, thereby carrying heat from the transformer coils to the thermally conductive members and from the thermally conductive members toward the surface of the laminate member. Various examples of such power modules are now described with reference to the drawings. The term "power module" is used frequently herein and, in some examples, the term "power module" refers to a package, such as a transformer package.

Figure 1A:
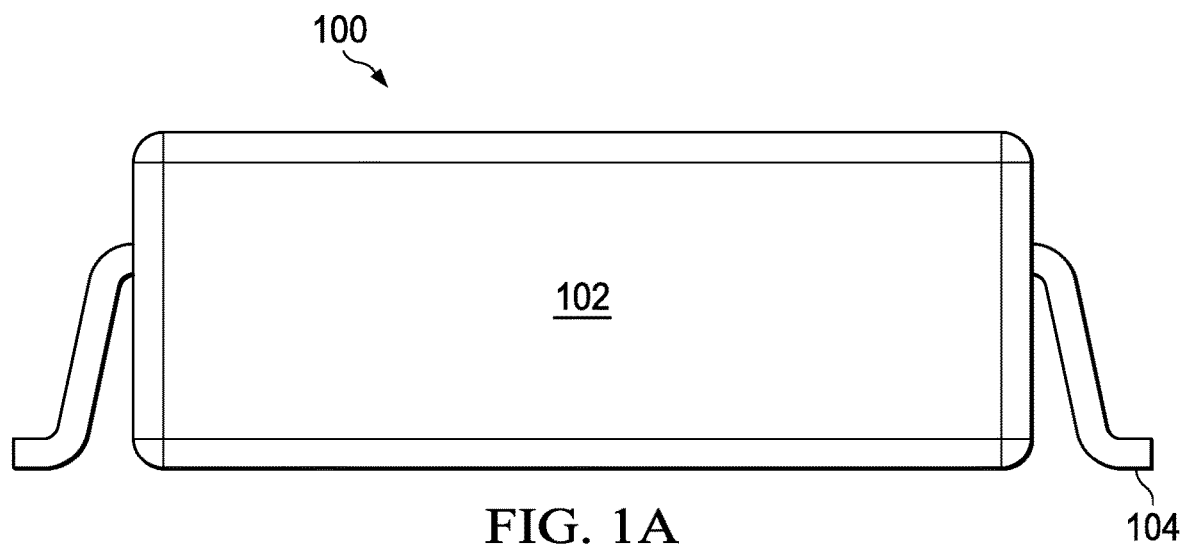
FIGS. 1A-1C are profile, top-down, and perspective views of a power module in accordance with various examples.
Figure 1C:
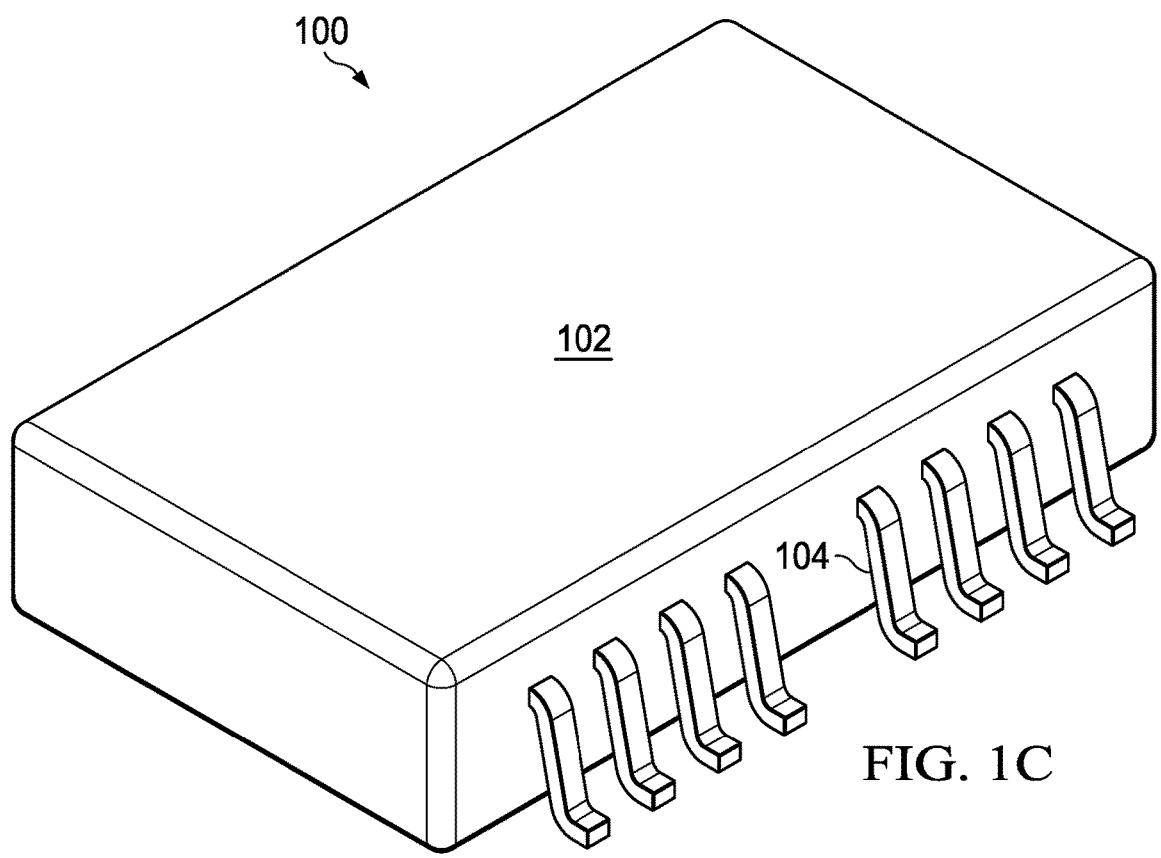
Figure 1B:
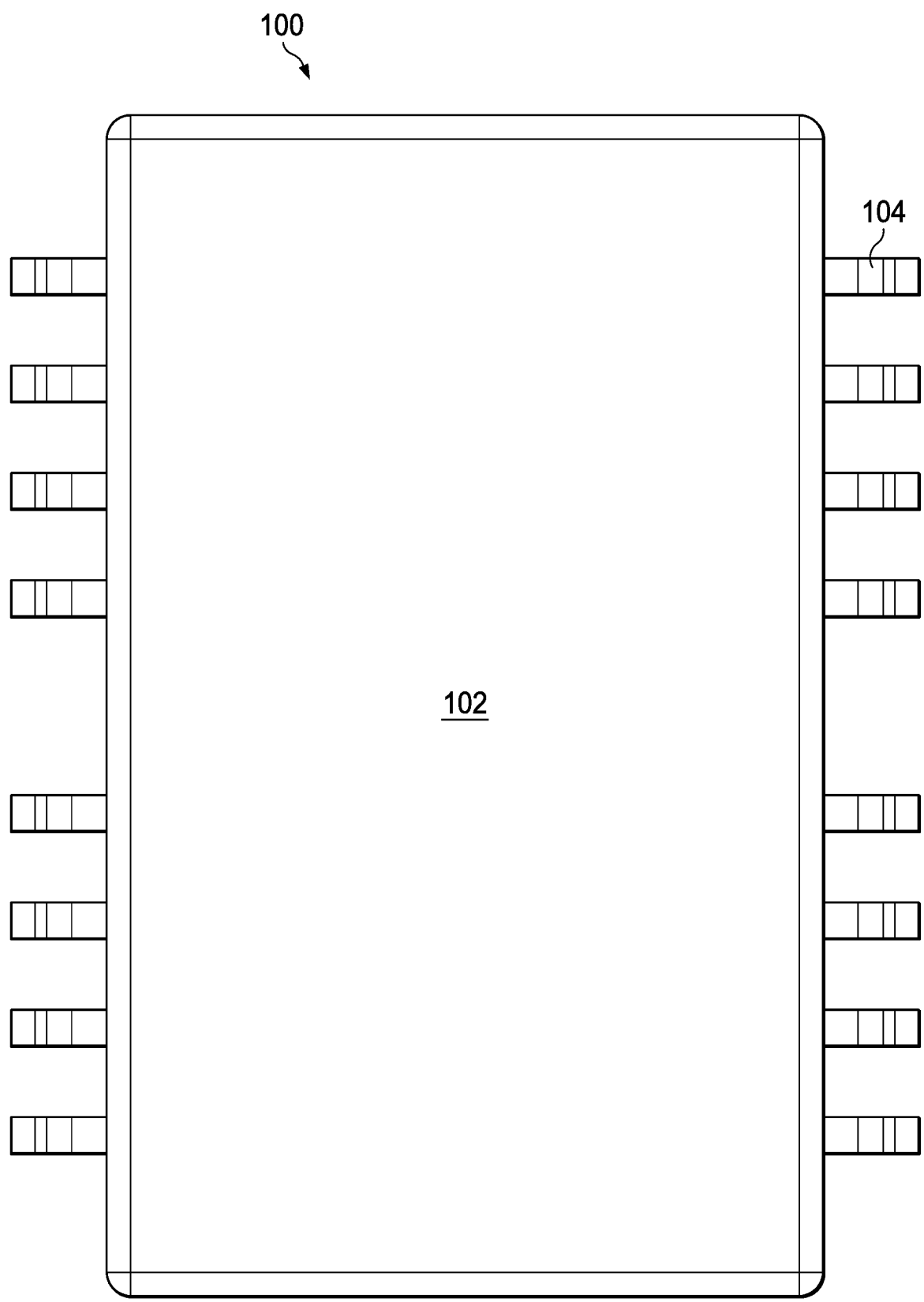

FIGS. 1A-1C are profile, top-down, and perspective views of a power module 100 in accordance with various examples. Specifically, FIG. 1A is a profile view of a power module 100 in accordance with various examples. The power module 100 is a leaded style package, such as a dual inline package (DIP), and the power module 100 includes a mold compound 102 and multiple conductive terminals, or leads, 104 arranged in any suitable pattern. The leads 104 may have any suitable shape, such as a gullwing shape, for example. The mold compound 102 covers a transformer that includes a laminate member having the features described above, including multiple sets of thermally conductive members. FIG. 1B is a top-down view of the power module 100, and FIG. 1C is a perspective view of the power module 100. Example contents of the power module 100 are described below.

Figure 2A:
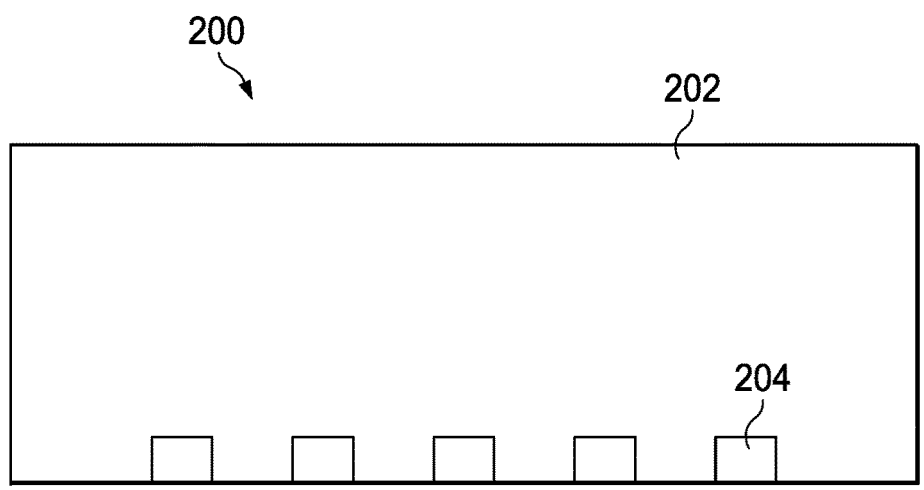
FIGS. 2A-2C are profile, bottom-up, and perspective views of a power module in accordance with various examples.
Figure 2B:
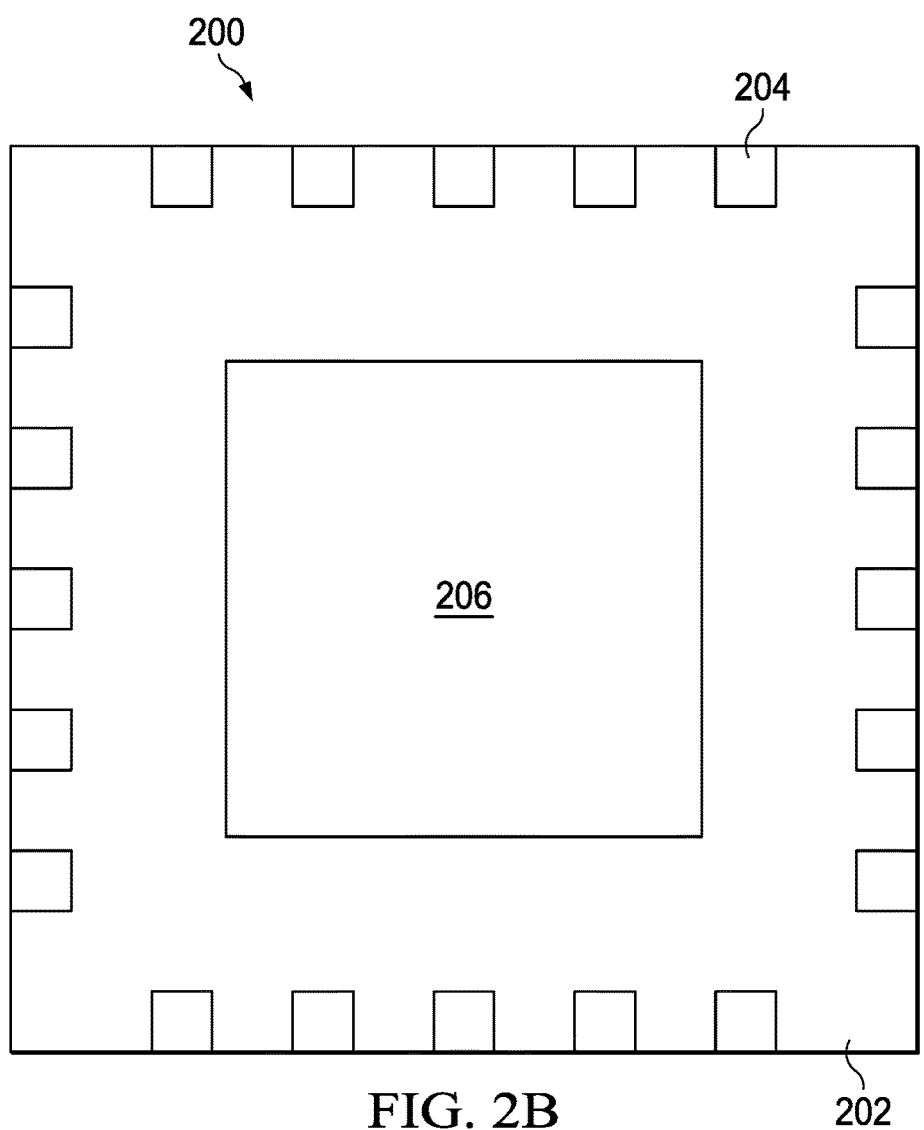
Figure 2C:
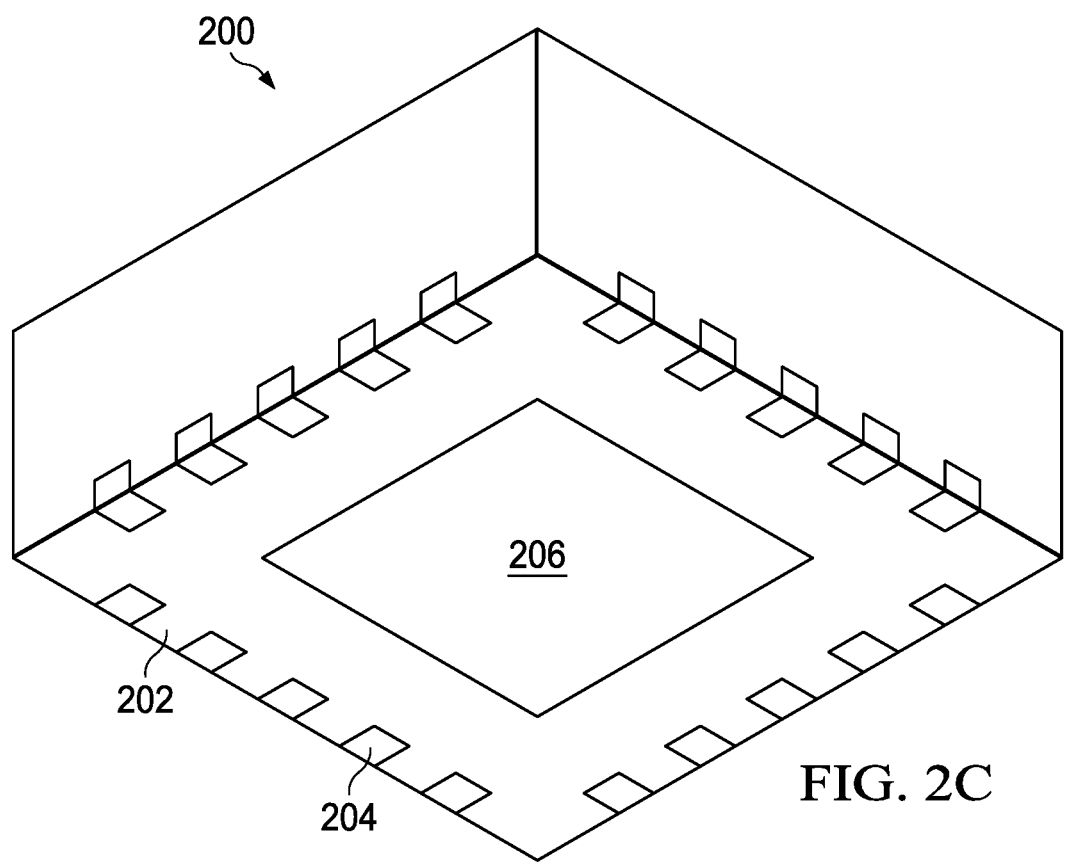

FIGS. 2A-2C are profile, bottom-up, and perspective views of a power module 200 in accordance with various examples. Specifically, FIG. 2A is a profile view of a power module 200 in accordance with various examples. The power module 200 is a leadless style package, such as a quad flat no-lead (QFN) package. The power module 200 includes a mold compound 202, multiple conductive terminals 204, and a platform (e.g., die pad) 206 (FIGS. 2B and 2C). The mold compound 202 covers a transformer that includes a laminate member having the features described above, including multiple sets of thermally conductive members. FIG. 2B is a bottom-up view of the power module 200, and FIG. 2C is a perspective view of the power module 200. Example contents of the power module 200 are described below.

Figure 3A:
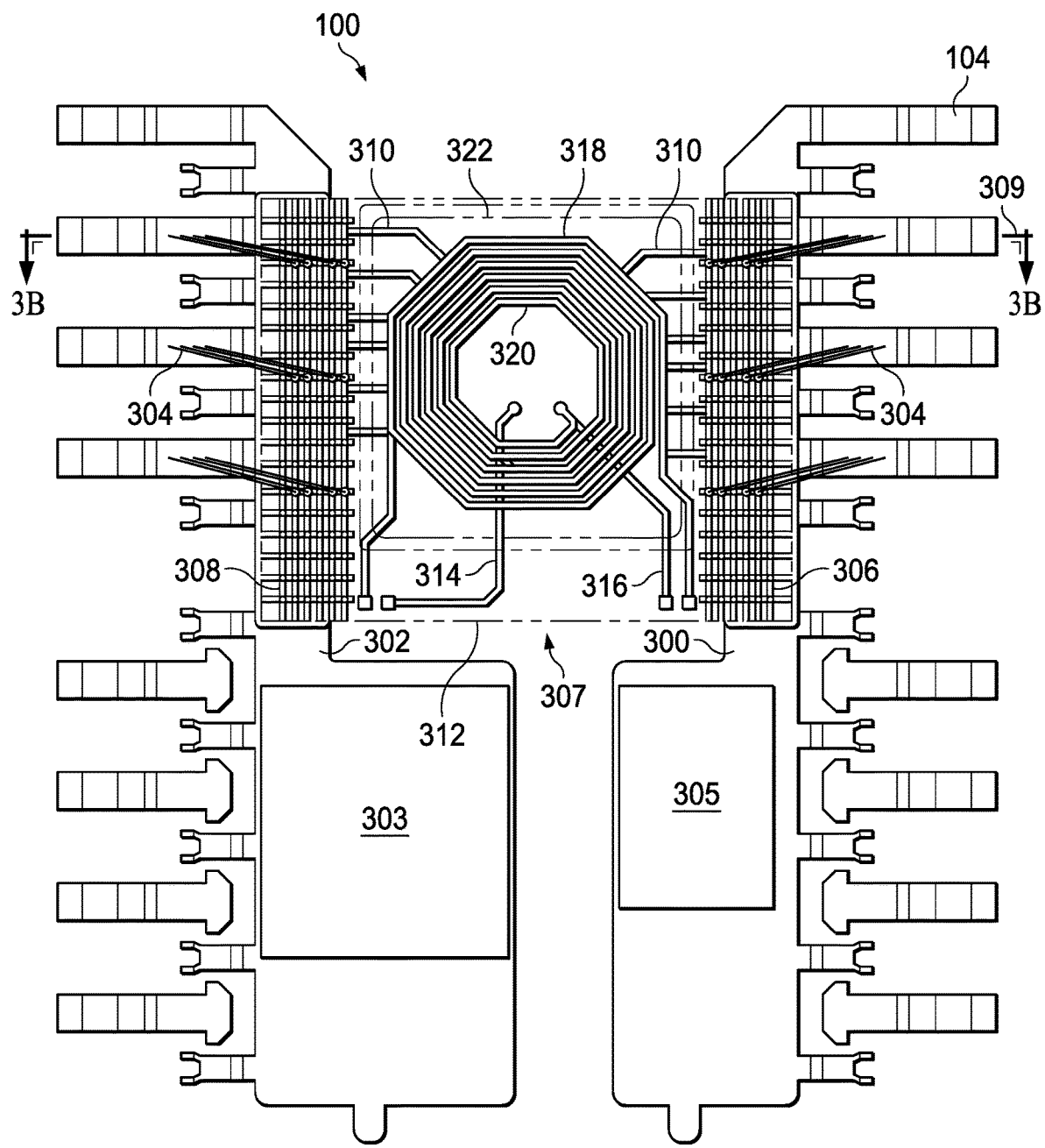

FIGS. 3A-3H are top-down, profile cross-sectional, and perspective views of a power module in accordance with various examples. Specifically, FIG. 3A is a top-down view of at least a portion of the contents of the power module 100. The power module 100 includes thermally conductive components 300, 302 (e.g., also called die pads) that couple to leads 104. Components other than a transformer, such as a processor, active components, or passive components may couple to the thermally conductive components 300, 302. Numerals 303, 305 represent such components.

A transformer 307 couples to the thermally conductive components 300, 302. In examples, the transformer 307 is an isolation transformer, and thus the thermally conductive components 300, 302 are physically separate from each other. The transformer 307 includes a laminate member 312. The laminate member 312 includes a transformer coil 314 and a transformer coil 316 that is physically separate from the transformer coil 314. Each transformer coil 314, 316 may have any suitable number of turns, depending on the application. Each transformer coil 314, 316 has two terminals that may be used to energize the respective transformer coils 314, 316, and these terminals are described below. The laminate member 312 also includes an EMI shield coil 318 and an EMI shield coil 320. In examples, the EMI shield coils 318, 320 are positioned between the transformer coils 314, 316. In examples, the transformer coils 314, 316 are positioned between the EMI shield coils 318, 320. In examples, the transformer coils 314, 316 may be interleaved with the EMI shield coils 318, 320 in any suitable pattern.

The transformer coils 314, 316 and the EMI shield coils 318, 320 are located in a portion of the laminate member 312 that is vertically aligned with a magnetic member 322. In FIG. 3A, the magnetic member 322 is depicted as being transparent to facilitate a view of the various components inside the laminate member 312. In addition to the portion of the laminate member 312 that is vertically aligned with the magnetic member 322, the laminate member 312 has portions on horizontally opposing ends of the laminate member 312 that include sets of thermally conductive members 306, 308. As explained above, the sets of thermally conductive members 306, 308 include three-dimensional matrices of thermally conductive members that transport heat away from the transformer coils 314, 316 and toward surfaces of the laminate member 312. In examples, the sets of thermally conductive members 306, 308 couple to the EMI shield coils 320, 318, respectively, via multiple thermal conductors 310. The thermal conductors 310 enable heat collected by the EMI shield coils 318, 320 from the transformer coils 314, 316 to be transferred to the sets of thermally conductive members 306, 308. In turn, the sets of thermally conductive members 306, 308 transfer the heat to surfaces of the laminate member 312. The laminate member 312 (e.g., the laminate itself and/or one or more of the thermally conductive members in the sets of thermally conductive members 306, 308) couples to the thermally conductive components 300, 302 by being mounted on the thermally conductive components 300, 302 and by coupling to the thermally conductive components 300, 302 via thermally conductive components 304 (e.g., bond wires). In some examples, the leads 104 coupled to the thermally conductive components 304 couple to ground.

Figure 3B:
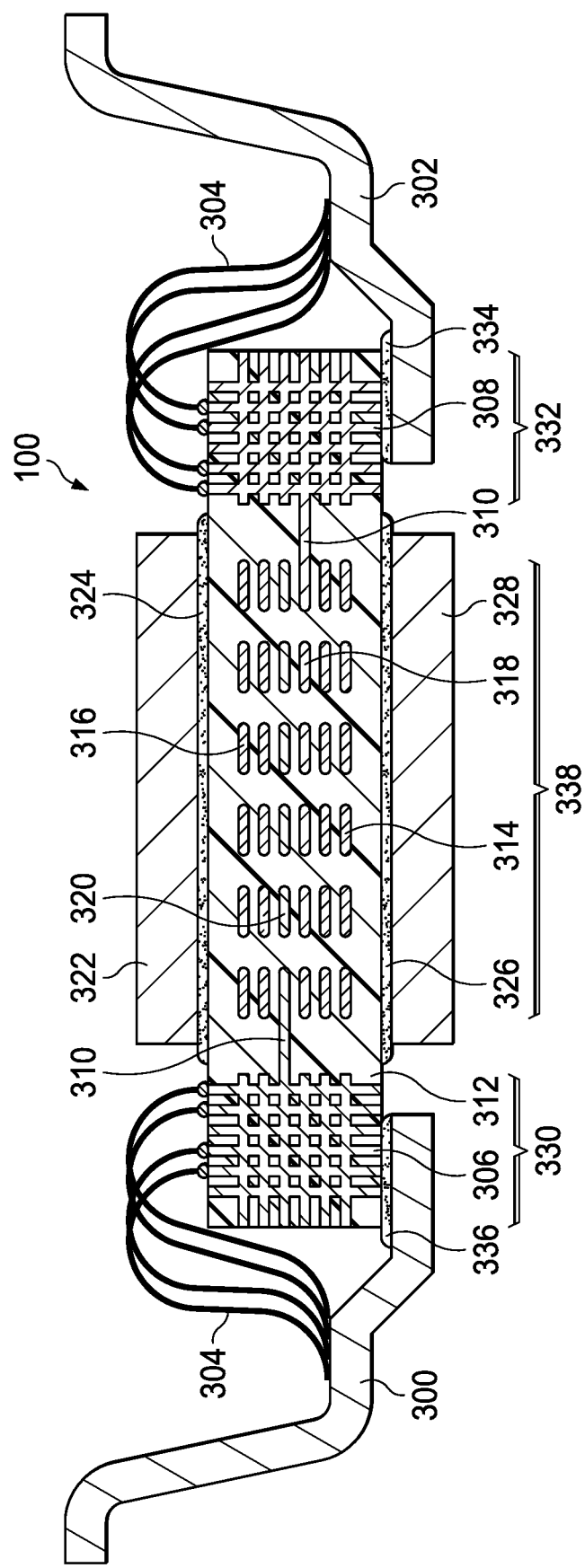

FIG. 3B is a profile cross-sectional view of the structure of FIG. 3A along cross-sectional line 309 (FIG. 3A). FIG. 3B depicts the laminate member 312, the magnetic member 322 coupled to the laminate member 312 via an adhesive layer 324, and a magnetic member 328 coupled to the laminate member 312 via an adhesive layer 326. As explained above, the laminate member 312 includes a portion 338, as well as portions 330, 332 that are on horizontally opposing ends of the portion 338. The portion 338 includes the transformer coils 314, 316. The portion 338 also includes EMI shield coils 318, 320. The portion 330 includes the set of thermally conductive members 306, and the portion 332 includes the set of thermally conductive members 308. Thermal conductors 310 couple the set of thermally conductive members 306 to the EMI shield coil 320, and other thermal conductors 310 couple the set of thermally conductive members 308 to the EMI shield coil 318. The portion 330 couples to the thermally conductive component 300 via an adhesive layer 336, and the portion 332 couples to the thermally conductive component 302 via an adhesive layer 334. The portion 330 also couples to the thermally conductive component 300 via a thermally conductive component 304 (e.g., a bond wire), and the portion 332 also couples to the thermally conductive component 302 via another thermally conductive component 304 (e.g., a bond wire).

In operation, as current flows through the transformer coils 314, 316, the transformer coils 314, 316 generate heat. A heat pathway formed by the EMI shield coil 320, a thermal conductor 310, and the set of thermally conductive members 306 transfers heat away from the transformer coil 316 and out of the laminate member 312 through the thermally conductive components 300, 304. Similarly, a heat pathway formed by the EMI shield coil 318, a thermal conductor 310, and the set of thermally conductive members 308 transfers heat away from the transformer coil 314 and out of the laminate member 312 through the thermally conductive components 302, 304.

The efficiency and effectiveness with which such heat pathways remove heat from the laminate member 312 may depend on various factors. Such factors include the precise distances between the EMI shield coil 320 and the transformer coils 314, 316, as well as the precise distances between the EMI shield coil 318 and the transformer coils 314, 316. Positioning the EMI shield coils 318, 320 too close to or too far from either of the transformer coils 314, 316 may produce potentially undesirable results. For example, placing an EMI shield coil 318, 320 too close to a transformer coil 314, 316 may result in inefficient operation due to transformer losses. Conversely, placing an EMI shield coil 318, 320 too far from a transformer coil 314, 316 may result in ineffective heat collection from the transformer coils 314, 316. Accordingly, in some examples, the shortest distance between the EMI shield coil 318 and the closer of the transformer coils 314, 316 is between 45 and 65 microns, and the same distance range is present between the EMI shield coil 320 and the closer of the transformer coils 314, 316.

Another such factor is the precise distances between the set of thermally conductive members 306 and the transformer coils 314, 316, as well as the precise distances between the set of thermally conductive members 308 and the transformer coils 314, 316. Positioning the sets of thermally conductive members 306, 308 too close to or too far from either of the transformer coils 314, 316 may produce potentially undesirable results. For example, placing a set of thermally conductive members 306, 308 too close to a transformer coil 314, 316 may result in inefficient operation due to transformer losses. Conversely, placing a set of thermally conductive members 306, 308 too far from a transformer coil 314, 316 may result in ineffective heat collection from the transformer coils 314, 316. Accordingly, in some examples, the smallest distance between the set of thermally conductive members 306 and the closer of the transformer coils 314, 316 is between 50 and 275 microns. Similarly, in some examples, the smallest distance between the set of thermally conductive members 308 and the closer of the transformer coils 314, 316 is between 50 and 275 microns.

Although not all examples include EMI shield coils 318, 320, and although EMI shield coils are not traditionally used for heat dissipation, the EMI shield coils 318, 320, when coupled to their respective sets of thermally conductive members 306, 308 by way of thermal conductors 310 have the potentially unexpected quality of transferring heat away from the transformer coils 314, 316 and out of the laminate member 312 as described above.

The sets of thermally conductive members 306, 308 may have varying configurations. FIGS. 3C1-3F2 depict a range of example configurations for the sets of thermally conductive members 306, 308. FIG. 3C1 is a profile cross-sectional view of the portion 332. In the example of FIG. 3C1, the thermally conductive members 308 extend through the thickness of the laminate member 312 so that the thermally conductive members 308 are exposed to top and bottom surfaces of the laminate member 312, as shown. Further, in the example of FIG. 3C1, the thermally conductive members 308 extend to the side surface of the laminate member 312 such that the thermally conductive members 308 are exposed to the side surface of the laminate member 312, as shown. In some examples, the vertical thermally conductive members 308 extend to the top and bottom surfaces while the horizontal thermally conductive members 308 do not extend to the side surface. In some examples, the vertical thermally conductive members 308 do not extend to the top and bottom surfaces while the horizontal thermally conductive members 308 do extend to the side surface. In some examples, the vertical thermally conductive members 308 extend to the top surface but not to the bottom surface, and vice versa. Thermally conductive members 308 also extend in a third dimension toward and away from the reader. FIG. 3C2 is a perspective view of the structure of FIG. 3C1.

FIG. 3D1 is another example of the set of thermally conductive members 308. In the example of FIG. 3D1, the set of thermally conductive members 308 includes plates 313 that cover one or more surfaces of the laminate member 312 and that couple to the remaining thermally conductive members 308. In examples, at least one of the plates 313 covers less than all of the surface of the laminate member 312 on which it is positioned, and in other examples, at least one of the plates 313 covers all of the surface of the laminate member 312 on which it is positioned. The plates 313 are a subset of the thermally conductive members 308 and differ from the remaining thermally conductive members 308 in shape, with the remaining thermally conductive members 308 being long, tubular members and the plates 313 being flat, rectangular members. The plates 313 may advantageously enhance heat dissipation. Thermally conductive members 308 also extend in a third dimension toward and away from the reader. FIG. 3D2 is a perspective view of the structure of FIG. 3D1.

FIG. 3E1 is another example of the set of thermally conductive members 308. In the example of FIG. 3E1, the set of thermally conductive members 308 are not exposed to a surface of the laminate member 312, as shown. Instead, the set of thermally conductive members 308 carry heat toward the surfaces of the laminate member 312, and the heat is transferred through the laminate member 312 to the thermally conductive components 304 and 302 (e.g., via the adhesive layer 334). Thermally conductive members 308 also extend in a third dimension toward and away from the reader. FIG. 3E2 is a perspective view of the structure of FIG. 3E1.

FIG. 3F1 is another example of the set of thermally conductive members 308. In the example of FIG. 3F1, the thermally conductive members 308 are configured similarly to the thermally conductive members 308 of FIG. 3D1, but the plates 313 are not exposed on the top, bottom, and side surfaces of the laminate member 312. Instead, the plates 313 remain inside the laminate member 312. The plates 313 radiate collected heat through the laminate member 312, and the thermally conductive components 304, 302 collect the heat. In some example variations, one of the plates 313 is exposed to a surface of the laminate member 312, while the remaining plates 313 are not exposed to any surfaces of the laminate member 312. In some example variations, some, but not all, of the plates 313 are exposed to a surface of the laminate member 312, while the remaining plate(s) 313 are not exposed to any surface of the laminate member 312. Thermally conductive members 308 also extend in a third dimension toward and away from the reader. FIG. 3F2 is a perspective view of the structure of FIG. 3F1. The description and depiction provided herein for the set of thermally conductive members 308 may also apply to the set of thermally conductive members 306.

Referring to FIGS. 3C1-3F2, the efficiency and pattern of heat dissipation may differ depending on the quantity, shapes, dimensions, and densities of the thermally conductive members 306, 308. For example, adequate heat dissipation may not be achieved without an adequate number of thermally conductive members 306, 308. However, increasing the number of thermally conductive members 306, 308 may increase cost and manufacturing complexity. Adequate heat dissipation may not be achieved with thermally conductive members 306, 308 of small dimensions. However, increasing the dimensions of the thermally conductive members 306, 308 may reduce the number of thermally conductive members 306, 308 that may be included, and may increase cost and manufacturing complexity. Adequate heat dissipation may not be achieved without a minimum density of the thermally conductive members 306, 308. However, increasing density may restrict the dimensions of the thermally conductive members 306, 308. In light of these potential consequences, various combinations of quantity, shapes, dimensions, and densities of the sets of thermally conductive members 306, 308 are possible and are contemplated. In some examples, each of the sets of thermally conductive members 306, 308 includes thermally conductive members having cross-sectional shapes selected from the group including rectangles, circles, ellipses, and polygons, maximal thermally conductive member cross-sectional dimensions (e.g., diameters in the case of circular cross-sections, or length/width in the case of rectangular cross-sections) ranging from 60 microns to 100 microns, and a density of thermally conductive members in a laminate member ranging from 20% to 25%. This combination may result in superior heat dissipation while maintaining acceptable levels of cost and manufacturing complexity, and without adversely impacting other performance features such as transformer efficiency. Other ranges and combinations are contemplated.

Figure 3G:
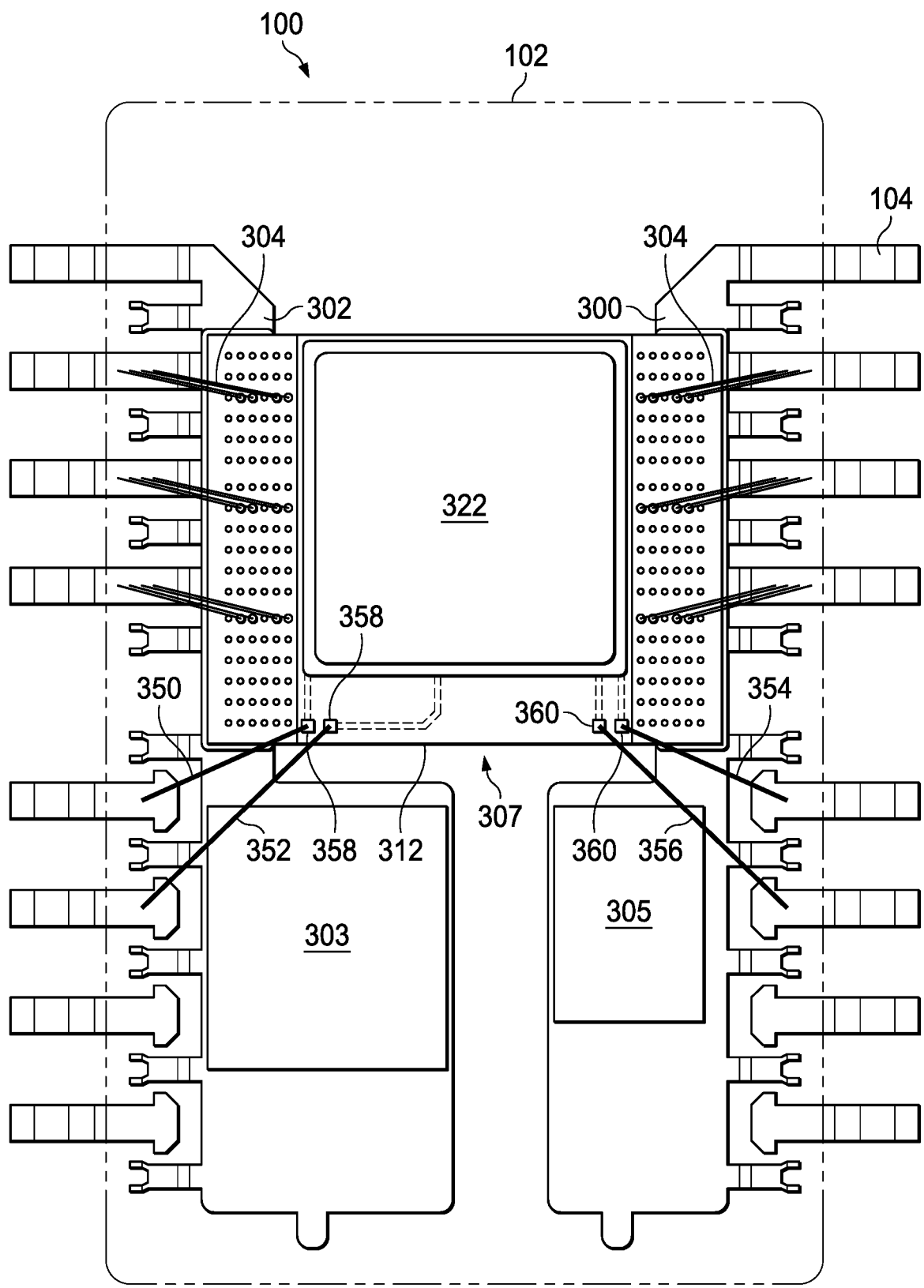

FIG. 3G is a top-down view of the structure of FIG. 3A. The power module 100 depicted in FIG. 3G is nearly identical to that shown in FIG. 3A, except that in FIG. 3G, the magnetic member 322 is shown as being opaque. Further, terminals 358, 360 of the transformer coils 314, 316 are shown. The terminals 358, 360 couple to respective leads 104 via bond wires 352, 354, 356, and 358, as shown.

Figure 3H:
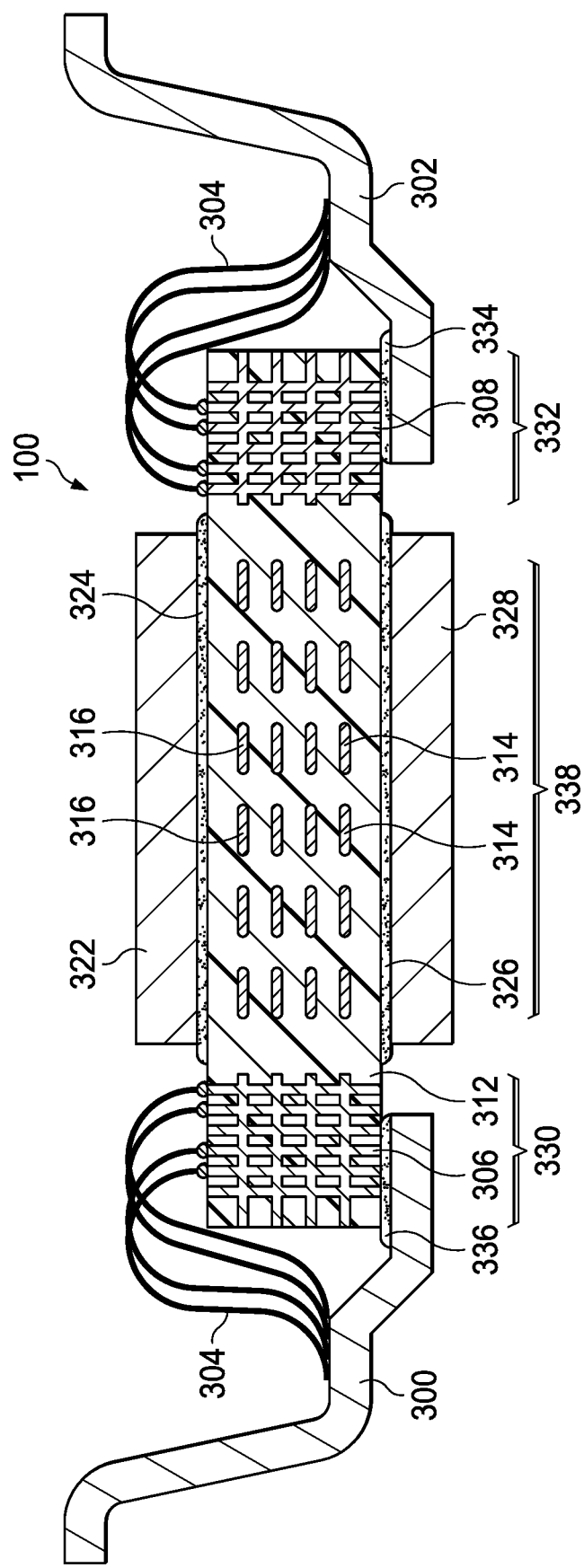

In the foregoing examples, the laminate member 312 includes the EMI shield coils 318, 320. However, in some examples, the EMI shield coils 318, 320 may be omitted. FIG. 3H is a profile cross-sectional view of a portion of a power module 100 in which EMI shield coils are omitted. In the structure of FIG. 3H, heat generated by the transformer coils 314, 316 is captured by the sets of thermally conductive members 306, 308. The heat is then removed from the laminate member 312 by the thermally conductive components 300, 302, 304. The heat capture in FIG. 3G may be less effective than in other examples due to the absence of the EMI shield coils 318, 320. However, one unexpected result of omitting the EMI shield coils 318, 320 is the efficient capture of heat by the sets of thermally conductive members 306, 308 through the laminate of the laminate member 312. To capture as much heat as possible, the sets of thermally conductive members 306, 308 may be located as close to the transformer coils 314, 316 as possible. However, if the sets of thermally conductive members 306, 308 are located too close to the transformer coils 314, 316, the transformer coils 314, 316 may experience losses and be inefficient. Accordingly, in some examples, the smallest distance between the set of thermally conductive members 306 and the closer of the transformer coils 314, 316 may range from 50 to 275 microns. Similarly, in some examples, the smallest distance between the set of thermally conductive members 308 and the closer of the transformer coils 314, 316 may range from 50 to 275 microns. In addition to location, heat capture may be enhanced by providing relatively large surface areas for the thermally conductive members in the sets of thermally conductive members 306, 308, particularly at the ends of the thermally conductive members closest to the transformer coils 314, 316. For example, the ends of the thermally conductive members 306, 308 facing the transformer coils 314, 316 may have surface areas ranging from $0.86 \times 10^6$ to $1.94 \times 10^6$ microns$^2$ and shapes suitable for producing such surface areas. Other distances are contemplated and included in the scope of this disclosure.

Figure 4A:
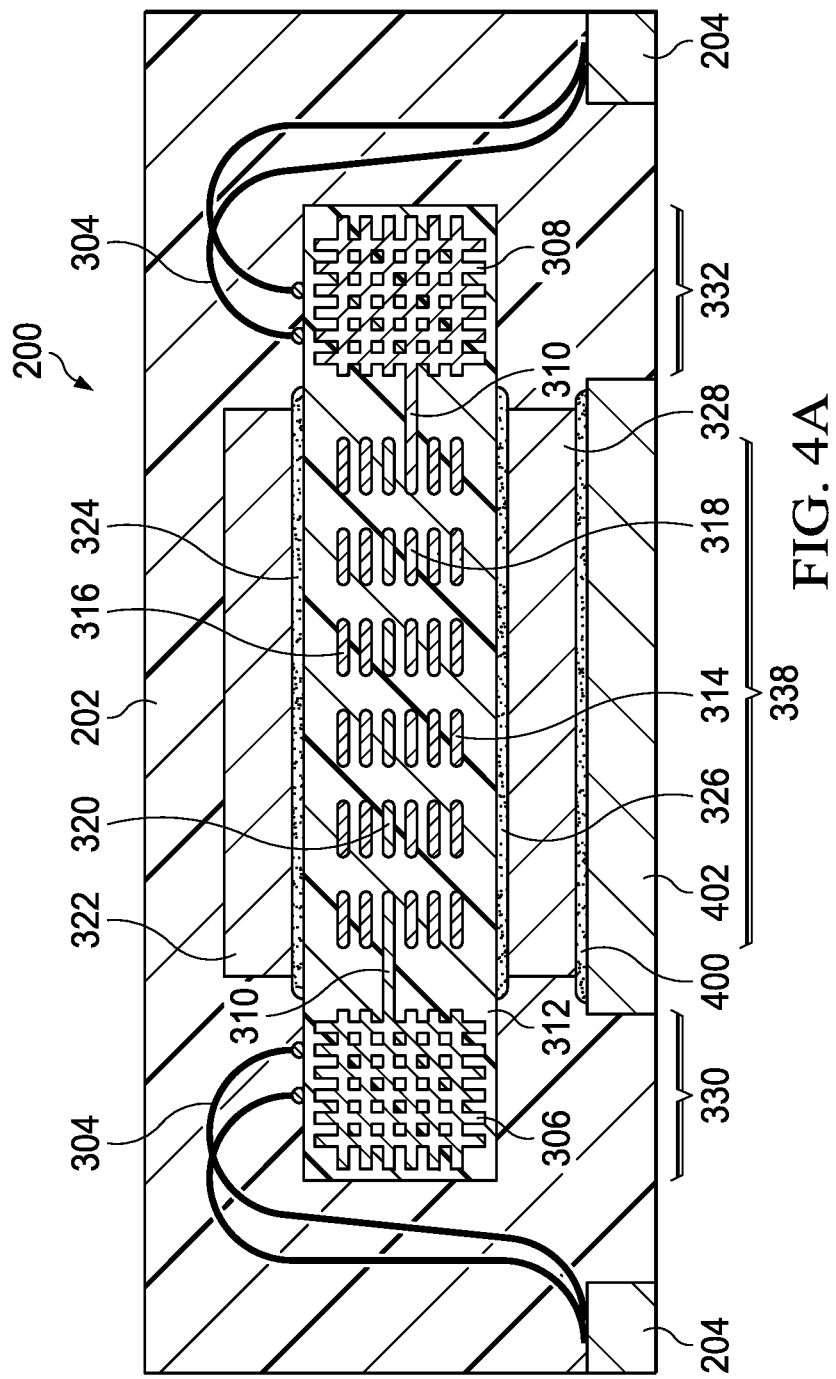
FIGS. 4A and 4B are profile cross-sectional and perspective views of a power module in accordance with various examples.
Figure 4B:
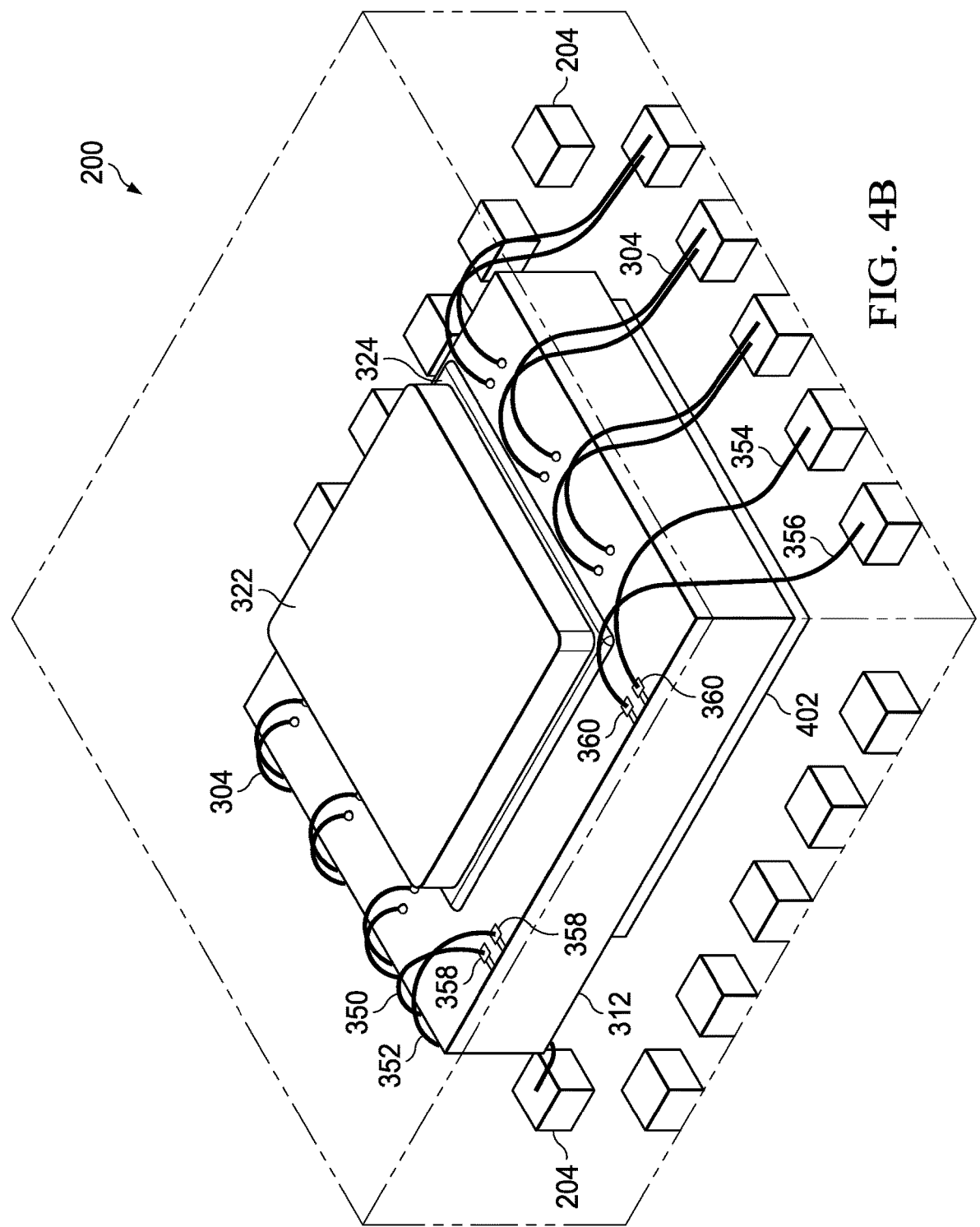

As explained above with reference to FIGS. 2A-2C, the power module 100 may be a leaded style package, but leadless packages (e.g., QFN packages) also may be used to implement any of the various examples described above with respect to FIGS. 3A-3H. FIGS. 4A and 4B are profile cross-sectional and perspective views of a QFN power module 200 in accordance with various examples. The QFN power module 200 includes the mold compound 202 and the conductive terminals 204. The mold compound 202 covers the laminate member 312, which couples to the magnetic member 322 via the adhesive layer 324 and which couples to the magnetic member 328 via the adhesive layer 326. The magnetic member 328 couples to a conductive pad (e.g., die pad) 402 via an adhesive layer 400. The laminate member 312 includes a portion 338 and portions 330, 332 on opposing ends of the portion 338. The portion 338 includes the transformer coils 314, 316 and the EMI shield coils 318, 320 that couple to the sets of thermally conductive members 308, 306 via the thermal conductors 310. The sets of thermally conductive members 306, 308 may have any suitable configuration, including the configurations described above with reference to FIGS. 3A-3H. Thermally conductive components (e.g., bond wire) 304 couple the portions 330, 332 of the laminate member 312 to the conductive terminals 204, as shown. FIG. 4B is a perspective view of the structure of FIG. 4A.

Figure 5:
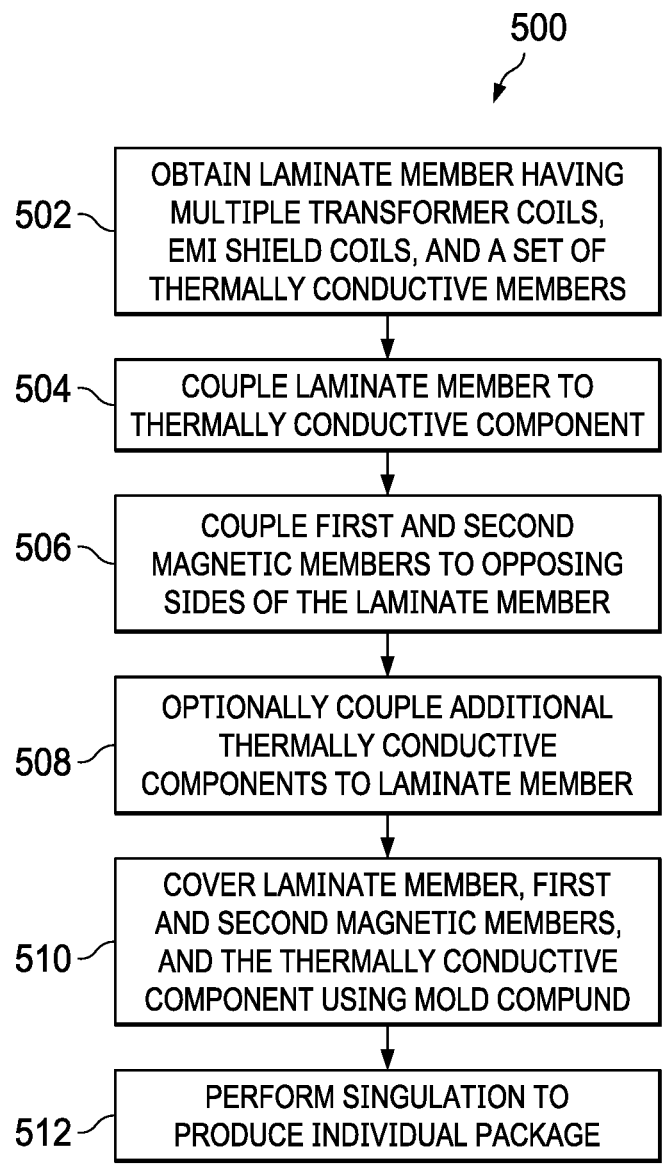
FIG. 5 is a flow diagram of a method for manufacturing a power module in accordance with various examples.

FIG. 5 is a flow diagram of a method 500 for manufacturing a power module in accordance with various examples. The method 500 includes obtaining a laminate member having multiple transformer coils, EMI shield coils, and a set of thermally conductive members (502). The method 500 includes coupling the laminate member to a thermally conductive component (504). The method 500 includes coupling the first and second magnetic members to opposing sides of the laminate member (506). The method 500 includes optionally coupling additional thermally conductive components to the laminate member (508). The method 500 includes covering the laminate member, first and second magnetic members, and the thermally conductive component using the mold compound (510). The method 500 includes performing singulation to produce an individual package (512).

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. Unless otherwise stated, "about," "approximately," or "substantially" preceding a value means+/−10 percent of the stated value. Modifications are possible in the described examples, and other examples are possible, within the scope of the claims.

What is claimed is:
1. An electronic device, comprising:
   a first magnetic member;
   a first adhesive layer abutting the first magnetic member;
   a second magnetic member;
   a second adhesive layer abutting the second magnetic member;
   a laminate member between the first and second adhesive layers, the laminate member comprising:
      first and second transformer coils;
      an electromagnetic interference (EMI) shield coil; and a set of thermally conductive members coupled to the EMI shield coil and extending in three dimensions, at least some of the thermally conductive members extending vertically through a thickness of the laminate member so as to be exposed to top and bottom surfaces of the laminate member; and a thermally conductive component coupled to at least one thermally conductive member in the set of thermally conductive members.

2. The electronic device of claim 1, wherein the laminate member includes a first portion vertically aligned with the first and second magnetic members and a second portion extending horizontally beyond the first and second magnetic members, the set of thermally conductive members in the second portion.

3. The electronic device of claim 2, further comprising first and second conductive metal components coupled to respective package leads, and wherein the first and second conductive metal components support the laminate member, the laminate member suspended over a gap between the first and second metal components.

4. The electronic device of claim 1, wherein the electronic device is a leaded package.

5. The electronic device of claim 1, wherein the electronic device is a quad flat no-lead (QFN) package.

6. The electronic device of claim 1, wherein the thermally conductive component is one of a bond wire and a metal component, the metal component coupled to a package lead.

7. The electronic device of claim 1, wherein the EMI shield coil is located at least 45 microns from each of the first and second transformer coils.

8. The electronic device of claim 1, wherein the set of thermally conductive members is located at least 50 microns from each of the first and second transformer coils.

9. The electronic device of claim 1, wherein a first thermally conductive member in the set of thermally conductive members extends vertically in the laminate member, and wherein a second thermally conductive member in the set of thermally conductive members extends horizontally in the laminate member.

10. An electronic device, comprising:
a first magnetic member;
a first adhesive layer abutting the first magnetic member;
a second magnetic member;
a second adhesive layer abutting the second magnetic member;
a laminate member having a first portion vertically aligned with the first and second magnetic members, the laminate member having a second portion extending beyond the first and second magnetic members in a horizontal plane, the laminate member comprising:
first and second transformer coils in the first portion; and
a set of thermally conductive members in the second portion, the set of thermally conductive members extending vertically through a thickness of the second portion; and
a thermally conductive component coupled to at least one thermally conductive member in the set of thermally conductive members.

11. The electronic device of claim 10, wherein each of the thermally conductive members in the set of thermally conductive members is located at least 50 microns from each of the first and second transformer coils.

12. The electronic device of claim 10, further comprising an electromagnetic interference (EMI) shield coil in the first portion.

13. The electronic device of claim 12, wherein the EMI shield coil is located at least 45 microns from each of the first and second transformer coils.

14. The electronic device of claim 10, wherein the thermally conductive component is a bond wire.

15. The electronic device of claim 14, wherein the thermally conductive component is a package lead.

16. An electronic device, comprising:
a first magnetic member;
a first adhesive layer abutting the first magnetic member;
a second magnetic member;
a second adhesive layer abutting the second magnetic member; and
a laminate member having a first portion abutting the first and second magnetic members, the laminate member having a second portion abutting one of a bond wire and a package lead, the laminate member having a third portion abutting one of another bond wire and another package lead, the laminate member including:
first and second transformer coils in the first portion;
first and second electromagnetic interference (EMI) shield coils in the first portion, each of the first and second EMI coils located at least 45 microns from each of the first and second transformer coils;
a first set of thermally conductive members in the second portion and coupled to the first EMI shield coil, the first set of thermally conductive members located at least 50 microns from each of the first and second transformer coils; and
a second set of thermally conductive members in the third portion and coupled to the second EMI shield coil, the second set of thermally conductive members located at least 50 microns from each of the first and second transformer coils.

17. The electronic device of claim 16, wherein the electronic device is one of a leaded package and a quad flat no-lead (QFN) package.

18. The electronic device of claim 16, further comprising a thermally conductive component coupled to the first set of thermally conductive members by way of an adhesive layer.

19. The electronic device of claim 16, wherein the first set of thermally conductive members includes at least one thermally conductive member that extends vertically through a thickness of the second portion.

20. The electronic device of claim 16, further comprising a plurality of bond wires coupled to the first set of thermally conductive members and a package lead coupled to the first set of thermally conductive members.

21. The electronic device of claim 16, wherein the thermally conductive members in the first set extend in three dimensions.

* * * * *